(12) United States Patent
Tomioka

(10) Patent No.: US 6,643,135 B2
(45) Date of Patent: Nov. 4, 2003

(54) ON BOARD MOUNTING ELECTRONIC APPARATUS AND ON BOARD MOUNTING ELECTRIC POWER SUPPLY

(75) Inventor: Satoshi Tomioka, Nagaoka (JP)

(73) Assignee: Densei-Lambda Kabushiki Kaisha (JP)

( * ) Notice: Subject to any disclaimer, the term of this patent is extended or adjusted under 35 U.S.C. 154(b) by 0 days.

(21) Appl. No.: 10/109,392

(22) Filed: Mar. 28, 2002

(65) Prior Publication Data

US 2002/0139467 A1 Oct. 3, 2002

(30) Foreign Application Priority Data

Mar. 28, 2001 (JP) .......................... 2001-093851

(51) Int. Cl.⁷ ................................................. H05K 7/20
(52) U.S. Cl. ........................................ 361/719; 363/141
(58) Field of Search ............................. 165/80.3, 185; 257/706, 707, 713, 719; 363/141; 174/16.3, 252, 52.2; 361/703–705, 709–713, 717–719, 722

(56) References Cited

U.S. PATENT DOCUMENTS

| | | | | |
|---|---|---|---|---|
| 5,305,185 A | * | 4/1994 | Samarov et al. | ............ 361/704 |
| 6,005,773 A | | 12/1999 | Rozman et al. | |
| 6,282,095 B1 | * | 8/2001 | Houghton et al. | .......... 361/704 |
| 6,377,461 B1 | * | 4/2002 | Ozmat et al. | |
| 6,396,701 B1 | * | 5/2002 | Nakamura et al. | .......... 361/706 |

OTHER PUBLICATIONS

USPGPub, US2001/0032738 A1, Dibene II, et al, Oct. 2001.*

* cited by examiner

Primary Examiner—Gerald Tolin
(74) Attorney, Agent, or Firm—Akerman Senterfitt

(57) ABSTRACT

An on-board mounting electronic apparatus including an apparatus body 6, made up of a main board 4 and terminal pins 5 for connection with a circuit board 21. The terminal pins 5 extend from an underside of the main board 4. A heat dissipation plate 8 is arranged on an upper surface of heat generating components 2 mounted on the main board 4. The heat dissipation plate 8 is thermally connected with the surface of the heat generating components 2. Such structure may be applied to an on-board mounting electric power supply as well.

15 Claims, 4 Drawing Sheets

ON BOARD MOUNTING ELECTRONIC APPARATUS AND ON BOARD MOUNTING ELECTRIC POWER SUPPLY

BACKGROUND OF THE INVENTION

1. Field of the Invention

The present invention relates to on-board mounting electronic apparatus mounted to circuit boards of end users and also to an on-board mounting electric power supply such as, for example, a DC/DC converter or the like.

2. Description of the Prior Art

Typically, for this kind of on-board mounting electronic apparatus, represented by an electric power supply provided with, for example, a DC/DC converter or the like, an electric power supply 57 serving as such on-board mounting electronic apparatus is shown in FIG. 3, for example, which comprises: a metallic board 51 formed by printing conductive patterns on one surface, i.e., an underside surface of a plate-like board member made from aluminum or the like with an insulation layer provided therebetween; a plurality of conductive terminal pins 52 for connection with external, extending from an underside of the metallic plate 51; an additional board 55 disposed opposite to the underside of the metallic board 51 and connected electrically to the metallic board 51 via the terminal pins 52 and other connector pins 53, said additional board 55 having a variety of electronic components 54 mounted on one or both surfaces thereof which generate comparatively small amount of heat; and a case 56 provided under the metallic board 51 in a manner that covers the board 55.

By inserting tip ends of the terminal pins 52 protruding from the underside of the case 56, into plated through-holes of circuit boards prepared by users in advance and then by fixing them by means of soldering, a thin and flat shaped electric power supply 57 and the circuit boards (not shown) are electrically connected to one another with the former being opposite to the latter.

In such electric power supply 57 assembled by using the above-mentioned metallic board 51, heat generating components 58 such as a main switching element, a rectifier diode and the like are mounted on the underside of the metallic board 51. Therefore, a heat sink 59 is attached to an upper side of the metallic board 51 so as to dissipate heat from the heat generating components 58. However, as the heat generating components 58 have to be mounted only on one side of the metallic board 51, there occurs a problem that the above-mentioned additional board 55 for mounting electronic components 54 thereon, must be provided, in addition to the metallic board 51.

To eliminate such problem, there is proposed an electric power supply 71 shown in FIG. 4 as another type of such an on-board mounting electronic apparatus. The electric power supply 71 comprises an apparatus body 75 with an electric power source circuitry, said electric power source circuitry including a board 73 having heat generating components 72 mounted on one or both sides thereof and a plurality of conductive terminal pins 74 for connection with the external, extending from an underside of the board 73. Thus, the apparatus body 75 is placed in a box-like case 76 whose interior is filled up with heat conductive resin 77 so that heat from the heat generating components 72 is transferred from the heat conductive resin 77 to the case 76 to dissipate heat outward. Depending on cases, a heat sink (not shown) is mounted on a flat upper surface of the case 76 to dissipate heat therefrom. According to such electric power supply 71, a variety of components including the heat generating components 72 can be mounted on both surfaces of the board 73 so that all of components can be mounted on a single sheet of the board 73.

According to the electric power supply 71 shown in FIG. 4, however, the apparatus body 75 has to be placed in the case 76 and then filled up with heat conductive resin 77 in order to enhance a heat dissipating performance of the apparatus body 75. As a result, it is difficult to enhance the heat dissipation performance of the apparatus body 75, in a simple manner.

SUMMARY OF THE INVENTION

To eliminate the abovementioned problem, it is, therefore, an object of the present invention to provide an on-board mounting electronic apparatus and an on-board mounting electric power supply which enable the enhancement of heat dissipation performance thereof with a simple structure despite electronic components being mounted on a common and single board.

An on-board mounting electronic apparatus according to a first aspect of the present invention includes an apparatus body composed of a main board and terminals for connecting the main board with an external circuit board, said terminals extending from an underside of the main board, wherein there is provided a heat dissipation plate which is thermally connected with upper surface of heat generating components mounted on the abovementioned main board Thus, in an apparatus body operating alone, only thermally connecting the heat dissipation plate with the upper surface of the heat generating components mounted on the main board allows heat from the heat generating components to be transferred directly to the heat dissipation plate mounted on the main board, thereby effectively dissipating heat therefrom. Accordingly, the heat dissipation performance of an apparatus body can be enhanced with a simple structure despite structural components being mounted on a common and single board.

The abovementioned also applies to an on-board mounting electric power supply according to another aspect of the present invention, wherein the dissipation performance of an apparatus body can be enhanced with the simple structure in the same way. Specifically, in this case, the enhanced heat dissipation performance enables the electric power supply to output greater power.

An on-board mounting electronic apparatus according to a second aspect of the present invention is one where stud members provided in the abovementioned heat dissipation plate is fixed on the circuit board in addition to the structure of the first aspect of the present invention.

In this case, the heat dissipation plate is arranged in a steady state at a predetermined height by fixing the stud members on the circuit board. As a mounting height relative to the circuit board can be simply adjusted by using the stud members, the mounting height from the circuit board to the upper surface of the heat dissipation plate can be simply adjusted to a desired value when an electric apparatus is connected to the circuit board by using terminals.

The abovementioned also applies to an on-board mounting electric power supply according to another aspect of the present invention, wherein a mounting height from the circuit board to the upper surface of the heat dissipation plate can be simply adjusted to a desired value.

An on-board mounting electronic apparatus according to a third aspect of the present invention is one where tap holes for fixing a heat sink arranged on the upper surface of the heat dissipation plate are formed in the stud members in addition to the first aspect of the present invention.

In this case, the stud members can be used not only for arranging the heat dissipation plate at a predetermined height but also for fixedly attaching the heat sink arranged on the upper surface of the heat dissipation plate.

The abovementioned also applies to an on-board mounting electric power supply according to another aspect of the present invention, the stud members can be used also for fixedly attaching the heat sink arranged on the upper side of the heat dissipation plate.

In a preferred form of the invention, the aforementioned terminals may comprise at least a pair of input terminals and at least a pair of output terminals.

Thus, an input voltage from the input terminals can be transformed to a desired voltage to output from the output terminals.

In a further preferred form of the invention, the main board may have a rectangular shape and the aforementioned input terminals and output terminals may be respectively arranged along both shortish sides thereof.

In this case, the input terminals and the output terminals can be respectively arranged in good order along both shortish sides of the rectangular-shaped main board.

In a still further preferred form of the invention, the main board is one wherein both shortish sides thereof have a length of 36.8 mm while both longish sides thereof 57.9 mm.

This enables the provision of an electric power supply with a dimensional standard that meets the needs from the market.

BRIEF DESCRIPTION OF THE DRAWINGS

For a more complete understanding of the present invention, reference is now made to the following description taken in conjunction with the accompanying drawings, in which.

DESCRIPTION OF THE PREFERRED EMBODIMENTS

Figure 1:
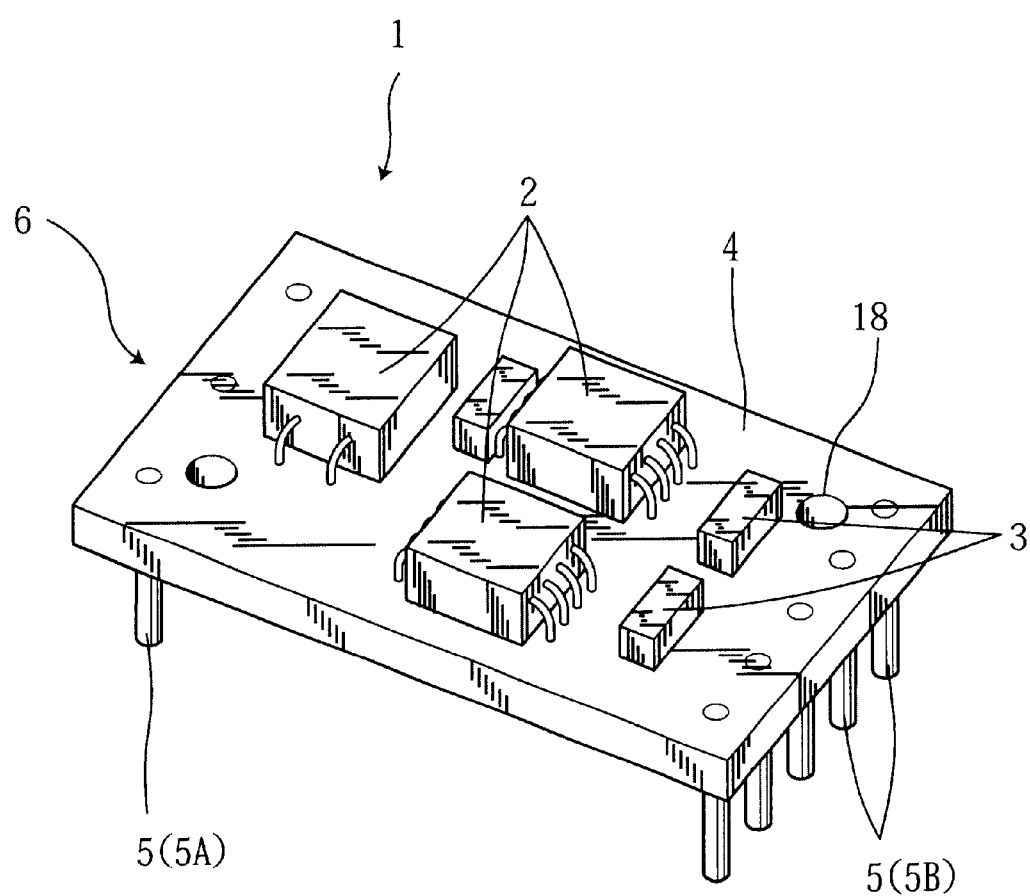
FIG. 1 is a perspective view showing an apparatus body according to an embodiment of the present invention.
Figure 2:
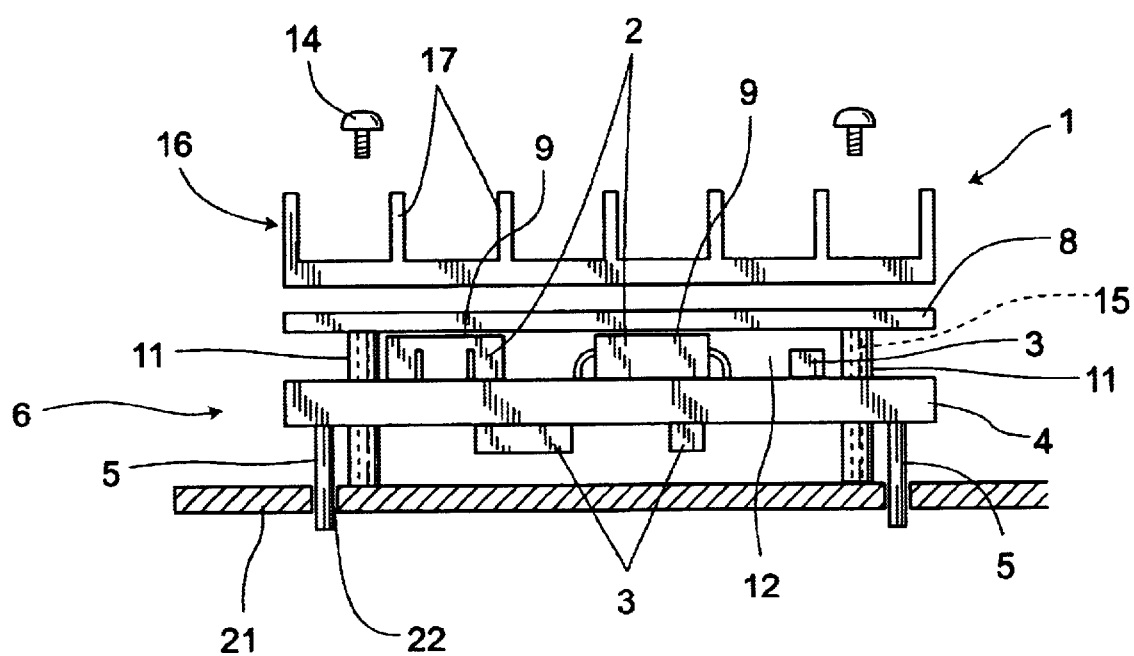
FIG. 2 is an exploded front view showing the apparatus body mounted on a circuit board.
Figure 3:
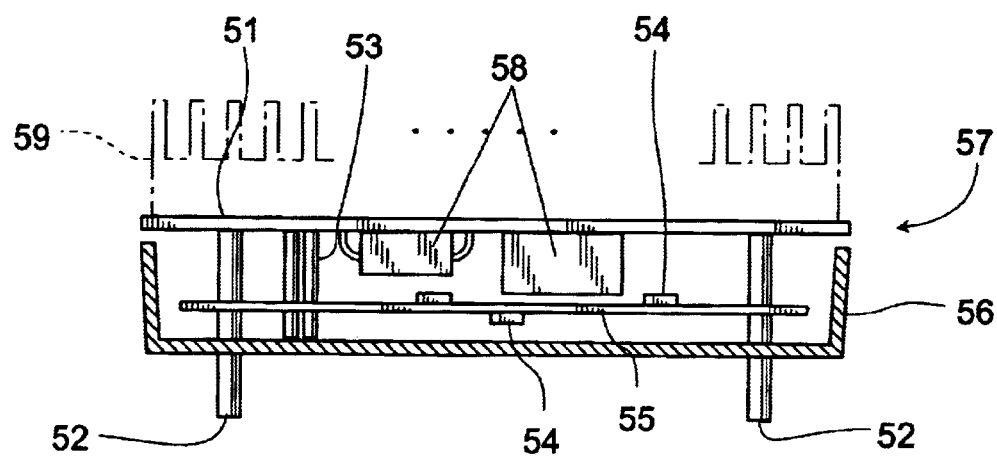
FIG. 3 is a partially cross-sectional view of an electric power supply showing a conventional example.
Figure 4:
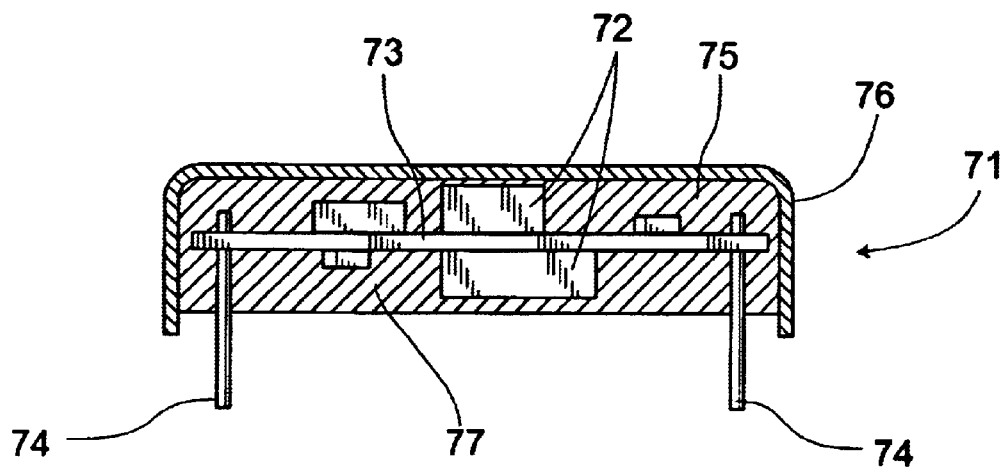
FIG. 4 is a partially cross-sectional view of an electric power supply showing another conventional example.

Hereunder is a detailed description of a preferred embodiment of the present invention with reference to accompanying drawings. In FIG. 1 and FIG. 2 showing an embodiment of present invention, numeral 1 denotes an electric power supply, corresponding to a thin and flat-shaped electronic apparatus such as a DC/DC converter or the like, which comprises an apparatus body 6, serving as a DC/DC converter in this example, made up of a rectangular-shaped main board 4 which permits heat generating components 2 having a heat generating tendency, such as a switching element, rectifier diode or the like and other electronic components 3 to be mounted on its both surfaces by, for example, soldering; and rod-shaped terminal pins 5 extending from an other side of the main board 4 than that on which the heat generating components 2 are mounted, that is, an underside of the main board 4. Among these components, the heat generating components 2 and the electronic components 3, which make up circuit elements of the electric power supply 1, are mounted on one side or both sides of the main board 4, depending upon the number of components. Particularly, the heat generating components which need heat dissipation are mounted on one side only, that is, the upper side of the main board 4.

The main board 4 is so sized that the shortish sides thereof have a length of 36.8 mm and the longish sides thereof 57.9 mm, respectively. These dimensions are set to meet the needs of the market for the electric power supply 1. The terminal pins 5 are made up of three input terminals 5A arranged along a first shortish side of the main board 4 and five output terminals 5B arranged along a second shortish side thereof. The input terminals 5A include at least a pair of terminals for applying an input voltage thereto and one control terminal. The output terminals 5B include at least a pair of terminals for supplying an output voltage and three control terminals for control of the respective functions of the electric power supply 1.

A heat dissipation plate 8 shaped like a metal plate, having good electric conductivity and made from aluminum or the like, is thermally connected with the upper surface of the heat generating components 2, using a thermally conductive material 9 such as a thermally conductive adhesive or a thermally conductive resin. The heat dissipation plate 8 has substantially the same rectangular shape as the aforementioned main board 4 with upper ends of cylindrical stud members 11 being press-fitted into its corner portions. The stud members 11 are allowed to penetrate through holes 18 defined through the corner portions of the main board 4, abutting against an upper surface (mounting surface) of a circuit board 21 described hereinafter to thereby determine a height from the circuit board 21 to the heat dissipation plate 8. Alternatively, lower ends of the stud members 11 may be screwed shut at the other side of the circuit board 21 opposite to the mounting surface of the circuit board 21 so as to fix the apparatus body 6 to the circuit board 21. Thus, the heat dissipation plate 8 can be arranged in a steady state at a height determined by making the circuit board 21 a reference point. It should be noted that the aforementioned mold material is not filled in an inter-space between the main board 4 and the heat dissipation plate 8, in which the heat dissipating components 2 and electronic components 3 are not arranged, so that a clearance 12 is formed to enable air to flow for ventilation.

The upper ends of the stud members 11 are provided with tap holes 15 into which screws 14, serving as a fixing member, are screwed. The tap holes 15 are used for fixing a heat sink 16 arranged in close contact with the upper surface of the heat dissipation plate 8, if necessary. When the heat sink 16 is utilized, the screws 14 are screwed into the tap holes 15 from the upper side of the heat sink 16. The heat sink 16 is made of a member with a good thermal conductivity such as aluminum and effectively dissipates heat transferred from the heat dissipation plate from a plurality of projected fins 17 thereon. Alternatively, shapes of the stud member 11 and the heat sink 16 should not be limited to those in the embodiment.

The circuit board 21 prepared by an user in advance is formed with plated through-holes, serving as a connecting portion, corresponding to each terminal pin 5 of the abovementioned electric power supply 1. Particularly on the circuit board 21 in communications apparatus and computer appliances are mounted a load such as an IC or the like other than the electric power supply 1, so that a plurality of such circuit boards 21 are arranged in slots (not shown in the figure) at certain intervals.

When the electric power supply 1 is mounted on the circuit board 21, the respective terminal pins 5 are inserted into the corresponding plated through holes 22 with the underside of the main board 4 being opposite to the surface of the circuit board 21. Then, when the electric power supply 1 reaches a predetermined height from the circuit board 21, the terminal pins 5 and the plated through holes 22 are connected by soldering while portions of the terminal pins 5 protruding from the underside of the circuit board 21 are properly cut away if necessary.

The apparatus body 6 of the electric power supply 1 according to the present embodiment is a complete component by itself, comprising the main board 4 having the aforementioned heat generating members 2 and other electronic components 3 mounted thereon and a plurality of the terminal pins 5 extending from the underside of the main board 4. When the apparatus body 6 is mounted to the circuit board 21 as it is, its mounting height is 12.7 mm or below. When the apparatus body 6 is operating alone, the heat from the heat generating components 2 is exchanged directly with that from the surrounding air to thereby carry out heat dissipation.

The heat dissipation plate 8 is mounted on the upper surface of the heat generating component 2 which make up a part of the apparatus body 6, with thermally conductive members 9 provided between them, so that heat from the heat generating components 2 is transferred to the heat dissipation plate 8 via the thermally conductive members 9 to perform heat exchange with the surrounding air, thereby dissipating heat effectively. Accordingly, if the same apparatus body 6 is used, yet better heat dissipation performance is obtained than the electric power supply 1 without the heat dissipation plate 8 and as a result of which, greater electric power can be outputted. Moreover, as the heat dissipation plate 8 is provided with the stud members 11 in advance, the heat dissipation plate 8 can be arranged in a steady state at a predetermined height by fixing the stud members 11 to the circuit board 21.

On the other hand, in order to further enhance the heat dissipation performance of the electric power supply 1, the heat sink 16 is mounted on the upper surface of the heat dissipation plate 8. Specifically, the heat sink 16 is mounted on the upper surface of the heat dissipation plate 8, and then the screws 14 are screwed from the upper side of the heat sink 16 into the tap holes 15 of the stud members 11 fitted, in advance, to the heat dissipation plate 8. Thus, with the same apparatus body 6 used, the electric power supply 1 can output greater power.

In the meantime, in recent on-board mounting electronic apparatus, a mounting height, at the time of mounting the electric power supply 1 on a circuit board by using the terminal pins 5, is typically determined by needs from the market. For example, in a DC/DC converter referred to as a power module and other electric power source modules, such mounting height typically is 12.7 mm. Many of recent thin type electric power supplies for use in telecommunication apparatus employ still thinner type whose mounting height is only 8.5 to 8.8 mm. Some noise filters used in combination with DC/DC converters have a mounting height of 12.7 mm. As is apparent from the foregoing, a mounting height of the electric power supply 1 when mounted on the circuit board 21 is standardized into generally two kinds of dimensions, that is, 12.7 mm or 8.5 mm.

In view of the abovementioned, when a plurality of the circuit boards 21 are arranged in slots at respective mounting height of about 12.7 mm, that is, at about 12.7 mm interval between the adjacent boards, the heat sink 16 may be fitted to the electric power supply 1. On the other hand, for about 8 to 9 mm interval between the adjacent boards, only the heat dissipation plate 8 may be fitted without the heat sink 16, or otherwise, the electric power supply 1 may be used without even using the heat dissipation plate 8. Thus, depending on a mounting height of the electric power supply 1, the heat sink 16 or the heat dissipation plate 8 can be optionally fitted or removed so that needs for different mounting heights can be satisfactorily met by using the same apparatus body 5.

As mentioned above, an on-board mounting electronic apparatus according to the present embodiment comprises the apparatus body 6 composed of the main board 4 and the terminal pins 5 for connecting the main board 4 with the external circuit board 21, said terminal pins 5 extending from an underside of the main board 4, wherein said on-board mounting electronic apparatus further comprises the heat dissipation plate 8 which is thermally connected with the upper surface of the heat generating components 2 mounted on said main board 4.

Thus, in the apparatus body 6 operating alone, only thermally connecting the heat dissipation plate 8 with the upper surface of the heat generating components 2 mounted on the main board 4 allows heat from the heat generating components 2 to be transferred directly to the heat dissipation plate 8 mounted on the main board 4, thereby effectively dissipating heat therefrom. Accordingly, the heat dissipation performance of the apparatus body 6 can be enhanced with a simple structure despite the structural components being mounted on a common and single board.

Specifically, as the on-board mounting electric power supply according to the present embodiment realizes such enhanced heat dissipation performance, it becomes possible to output greater power.

Further, with the abovementioned structure according to the present embodiment, the stud members 11 mounted on the heat dissipation plate 8 are fixed on the circuit board 21. By fixing the stud members 11 on the circuit board 21, the heat dissipation plate 8 can be arranged in a steady state at a predetermined height. Thus, the height of the heat dissipation plate 8 relative to the main board 4 is made adjustable by the stud members 11 so that a mounting height from the circuit board 21 to the upper surface of the heat dissipation plate 8 can be simply set at a desired value when the electric power supply 1 is mounted on the circuit board 21 by using the terminal pins 5.

Still further, with the abovementioned structure according to the present embodiment, the tap holes 15, for fixing the heat sink 16 arranged on the upper surface of the heat dissipation plate 8, are formed in the stud members 11. Thus, the stud members 11 can be used not only for arranging the heat dissipation plate 8 at a predetermined height but also for fixing the heat sink 16 arranged on the upper surface of the heat dissipation plate 8.

Furthermore, according to the on-board mounting electric power supply of the present embodiment, the terminals 5 are made up of at least a pair of the input terminals 5A and at least a pair of the output terminals 5B. Thus, a voltage from the input terminals 5A can be transformed to a desired voltage to output from the output terminals 5B.

Moreover, the main board 4 is rectangular-shaped, and the input terminals S5 and the output terminals 5B are each arranged along the opposite shortish sides thereof. Therefore, along both shortish sides of the rectangular-shaped main board 4, the input terminals 5A and the output terminals 5B can be arranged in good order, respectively.

In addition to the foregoing, according to the on-board mounting electronic apparatus according to the present embodiment, the shortish side of the main board 4 is 36.8 mm long while the longish side thereof is 57.9 mm long. Accordingly, an electric power supply with a dimensional standard that meets the needs of the market can be provided.

The present invention should not be limited to the abovementioned embodiment but various modifications are possible. For example, although the electric power supply 1 is specifically described as a DC/DC converter in the embodiment, the present invention can be applied to various on-board mounting electronic apparatus other than the abovementioned one.

What is claimed is:

1. An on-board mounting electronic apparatus which comprises:

an apparatus body composed of a main board;

terminals for connecting the main board with a circuit board, said terminals extending from an underside of the main board; and a heat dissipation plate which is thermally connected with an upper surface of heat generating components mounted on the main board, with electronic components being mounted on both upper and underside surfaces of said main board.

2. An on-board mounting electronic apparatus according to claim 1, wherein stud members are provided in said heat dissipation plate, said stud members being fixed on said circuit board to adjust a height of the heat dissipation plate.

3. An on-board mounting electronic apparatus according to claim 2, wherein tap holes for fixing a heat sink arranged on an upper surface of said heat dissipation plate are formed in said stud members.

4. An on-board mounting electronic apparatus according to claim 1, wherein said electronic apparatus is a power supply.

5. An on-board mounting electronic apparatus according to claim 4, wherein said terminals are made up of at least a pair of input terminals and at least a pair of output terminals.

6. An on-board mounting electronic apparatus according to claim 5, wherein said main board is rectangular-shaped, while said input terminals and said output terminals are arranged along opposite shortish sides of the main board, respectively.

7. An on-board mounting electronic apparatus according to claim 6, wherein a shortish side of said main board is 36.8 mm long while a longish side thereof is 57.9 mm long.

8. An on-board mounting electronic apparatus according to claim 4, wherein stud members fitted to said heat dissipation plate are fixed on said circuit board to adjust a height of the heat dissipation plate.

9. An on-board mounting electronic apparatus according to claim 8, wherein said terminals are made up of at least a pair of input terminals and at least a pair of output terminals.

10. An on-board mounting electronic apparatus according to claim 9, wherein said main board is rectangular-shaped, while said input terminals and said output terminals are arranged along opposite shortish sides of the main board, respectively.

11. An on-board mounting electronic apparatus according to claim 10, wherein a shortish side of said main board is 36.8 mm long while a longish side thereof is 57.9 mm long.

12. An on-board mounting electronic apparatus according to claim 8, wherein tap holes for fixing a heat sink arranged on an upper surface of said heat dissipation plate are formed in said stud members.

13. An on-board mounting electronic apparatus according to claim 12, wherein said terminals are made up of at least a pair of input terminals and at least a pair of output terminals.

14. An on-board mounting electronic apparatus according to claim 13, wherein said main board is rectangular-shaped, while said input terminals and said output terminals are arranged along opposite shortish sides of the main board, respectively.

15. An on-board mounting electronic apparatus according to claim 14, wherein a shortish side of said main board is 36.8 mm long while a longish side thereof is 57.9 mm long.

* * * * *